(12) United States Patent
Tei

(10) Patent No.: US 7,699,209 B2
(45) Date of Patent: *Apr. 20, 2010

(54) WIRE BONDING APPARATUS, RECORD MEDIUM STORING BONDING CONTROL PROGRAM, AND BONDING METHOD

(75) Inventor: Shinsuke Tei, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 596 days.

This patent is subject to a terminal disclaimer.

(21) Appl. No.: 11/646,677

(22) Filed: Dec. 28, 2006

(65) Prior Publication Data

US 2007/0187470 A1 Aug. 16, 2007

(30) Foreign Application Priority Data

Dec. 28, 2005 (JP) ............................. 2005-378451

(51) Int. Cl.
*B23K 31/02* (2006.01)
*B23K 37/00* (2006.01)

(52) U.S. Cl. ............................. 228/102; 228/4.5; 228/8; 228/103; 228/105; 228/180.5

(58) Field of Classification Search ........................ None
See application file for complete search history.

(56) References Cited

U.S. PATENT DOCUMENTS

| 5,456,403 A | 10/1995 | Nishimaki et al. |
| 5,474,224 A | 12/1995 | Nishimaki et al. |
| 5,566,876 A | 10/1996 | Nishimaki et al. |
| 6,070,778 A * | 6/2000 | Takahashi et al. ............. 228/4.5 |
| 6,095,396 A * | 8/2000 | Takahashi et al. ............. 228/4.5 |
| 6,189,765 B1 * | 2/2001 | Moon ......................... 228/102 |
| 6,492,828 B2 * | 12/2002 | Ming-Hsun et al. .......... 324/763 |
| 7,000,822 B2 * | 2/2006 | Dacanay et al. ........... 228/180.5 |
| 7,140,529 B2 * | 11/2006 | Kondo ......................... 228/4.5 |
| 2001/0016786 A1 * | 8/2001 | Takahashi et al. ............ 700/195 |
| 2003/0123866 A1 * | 7/2003 | Hayata ........................ 396/80 |
| 2005/0133563 A1 * | 6/2005 | Kim et al. .................... 228/4.5 |
| 2007/0187138 A1 * | 8/2007 | Takahashi et al. ............ 174/257 |

FOREIGN PATENT DOCUMENTS

| JP | 2-12932 | | 1/1990 |
| JP | 02094454 A | * | 4/1990 |
| JP | 2-298874 | | 12/1990 |
| JP | 7-94545 | | 4/1995 |
| JP | 2992427 | | 10/1999 |

\* cited by examiner

*Primary Examiner*—Kiley Stoner
(74) *Attorney, Agent, or Firm*—William L. Androlia; H. Henry Koda

(57) ABSTRACT

A bonding method involving detection of non-bonding of a bonding wire to a first bonding point, the method including an electrical non-bonding detection step and an optical non-bonding detection step, wherein data on whether the respective first bonding points are predetermined bonding points where an electrical non-bonding detection is not applicable are acquired from a memory unit; and when it is determined that a first bonding point is the predetermined bonding point, a non-bonding verification on the first bonding point is executed in the optical non-bonding detection step, and when the first bonding point is not the predetermined bonding point, then non-bonding detection on the first bonding point is executed in the electrical non-bonding detection step.

9 Claims, 13 Drawing Sheets

| SEMICONDUCTOR PAD NUMBER | DC ELECTRICAL NON-BONDING DETECTION TYPE |
|---|---|
| 1 | POS |
| 2 | POS |
| 3 | NEG |
| 4 | POS |
| 5 | NO |
| 6 | NEG |
| . | . |
| . | . |
| . | . |
| 98 | NO |
| 99 | POG |
| 100 | NEG |

FIG. 3A

| SEMICONDUCTOR PAD NUMBER | AC ELECTRICAL NON-BONDING DETECTION TYPE |
|---|---|
| 1 | YES |
| 2 | NO |
| 3 | YES |
| 4 | YES |
| 5 | YES |
| 6 | NO |
| . | . |
| . | . |
| . | . |
| 98 | NO |
| 99 | YES |
| 100 | YES |

FIG. 3B

WIRE BONDING APPARATUS, RECORD MEDIUM STORING BONDING CONTROL PROGRAM, AND BONDING METHOD

BACKGROUND OF THE INVENTION

The present invention relates to a wire bonding apparatus, record medium storing bonding control program, and bonding method for detecting non-bonding at a bonding point.

One of the assembly processes for semiconductors such as ICs (integrated circuits) is a wire bonding process for connecting between the semiconductor chip and lead frame with wires.

In a typical wire bonding process, as seen from FIG. 14, pads 3 (first bonding points) of a semiconductor chip 2 and leads 4 (second bonding points) of a lead frame 15, both on a work 14, are connected by wires 12. FIG. 13 shows bonding steps in the conventional wire bonding process, and this conventional wire bonding process will be described below with reference to FIG. 13.

A conventional wire bonding apparatus executes wire bonding by the actions (steps) shown in FIG. 13.

(1) The tip end of a wire 12 is formed into a ball 5, and a capillary 16 is moved over a pad 3 (first bonding point) (step (a)).

(2) The capillary 16 is caused to descend, and bonding is performed on the pad 3 (first bonding point) (step (b)). The ball 5 is pressure-bonded on the pad 3 (first bonding point), so that a first bond portion 6 (pressure-bonded ball) is formed.

(3) After bonding, the capillary 16 ascends, separating from the pad 3 (first bonding point), and then moves laterally (step (c)).

(4) During this lateral movement of the capillary 16, an electric current is made to flow from the wire 12 to the work 14. When, at that time, bonding to the pad 3 (first bonding point) is successful and the bonding has been performed well, an electric current is made to flow from the wire 12 to the work 14 in step (c) (for example Patent Publication 1).

(5) After bonding to the pad 3 (first bonding point), the capillary 16 is moved to the lead 4 (second bonding point), and bonding is performed at the lead 4 (second bonding point).

(6) After bonding to the second bonding point, when the capillary 16 is caused to ascend, an electric current is caused to flow from the wire 12 to the work 14. When bonding to the lead 4 (second bonding point) is successful, and a tail wire 8 is formed properly at the tip of the capillary 16, a current is able to flow from the wire 12 to the work 14. Conversely, if the wire 12 is cut while the capillary 16 is ascending, the current will cease to flow from the wire 12 to the work 14. As a result, it is possible to detect whether or not there is a no-tail with the tail wire 8 not attaining a prescribed length (steps (d) and (e)).

(7) After the bonding to the lead 4 (second bonding point), a clamper 17 closes and ascends together with the capillary 16, and, as a result, the wire 12 is cut above the second bond portion 7 (steps (e) and (f)). After this wire cutting also, a current is made to flow from the wire 12 to the work 14, and non-bonding detection is conducted.

(8) When bonding to the lead 4 (second bonding point) finishes, the capillary 16 is moved toward the next pad 3 (first bonding point).

In the conventional wire bonding process as described above, wire non-bonding is detected by causing an electric current to flow from the wire 12 to the work 14. This electrical non-bonding detection is executed by devices such as those shown in FIG. 11 and FIG. 12. FIG. 11 shows a direct current (DC) electrical conduction state acquisition device 22a for applying a direct current from a wire to a work, while FIG. 12 shows an alternating current (AC) electrical conduction state acquisition device 22b for causing alternating current to flow from a wire to a work.

The DC electrical conduction state acquisition device 22a, when a wire is connected to a semiconductor chip 2, uses the flow of electric current from the wire 12 to the work 14 to acquire the electrical conduction state for detecting bonding and non-bonding, and it comprises a positive voltage power supply 55 for applying a positive voltage to the wire 12 and a negative voltage power supply 56 for applying a negative voltage to the wire 12. By a switch 54 for switching between those two power supplies, the positive or negative power supply is connected through a resistor 57 to the input side of a detector 58. On the input side of the detector 58, an on-off switch 52 for turning the current to the wire 12 on and off is provided. The on-off switch 52 is connected to the spool 11 on which the wire 12 is wound and thereby electrically connected to the wire 12. The reason why the DC electrical conduction state acquisition device 22a has two types of power supply, namely a positive and a negative one, is that there are circuits on the semiconductor chip 2 which apply a positive current to the pad 3 and circuits which apply a negative current thereto, depending on the circuit configuration.

The DC electrical conduction state acquisition device 22a structured described above acquires the electrical conduction state in the following manner: depending on the properties of the first bonding point, either a positive voltage or a negative voltage power supply is selected by the switch 54; when the on-off switch 52 is closed, because one of the power supplies will be grounded together with the work 14, a current will flow from the power supply 55 or 56 through the pad 3 to the semiconductor chip 2; at that time, when the wire 12 is non-bonding (or is not bonded), then the current will not flow to the wire 12, but will flow toward the detector 58, and the voltage on an output terminal 59 of the detector 58 will either rise or fall (see cf. Patent Publication. H2 (1990)-298874 1 and No. H7 (1995)-94545, for example). This voltage change is sensed and non-bonding is detected accordingly.

Meanwhile, due to the characteristics of the circuitry on the semiconductor chip 2, some pads 3 (first bonding points) have a very large resistance and are not conductive with the work 14, exhibiting characteristics such that a direct current will not flow at all. For such pads 3 (first bonding points) in which a direct current does not flow, the electrical conduction state cannot be detected with the DC electrical conduction state acquisition device 22a described above. For this reason, as a means for acquiring the electrical conduction state of a pad 3 (first bonding point) in which such a DC electrical conduction state acquisition device 22a cannot be used, there are AC electrical conduction state acquisition device 22b. The AC electrical conduction state acquisition device 22b causes an alternating current to flow from the wire 12 to the work 14, making use of the fact that an alternating current will flow due to the electrostatic capacitance of the pad 3 and semiconductor chip 2. The function thereof is similar to that of DC electrical conduction state acquisition device 22a; in other words, an alternating current is made to flow to the wire 12 when the on-off switch 52 is turned on and the electrical conduction state is acquired.

However, with such an AC electrical conduction state acquisition device 22b, in cases where the electrostatic capacitance of pads 3 and semiconductor chips 2 is very small, no alternating current will flow and the electrical conduction state is unable to be detected. In view of the fact that it is difficult to switch between such AC and DC type electrical conduction state acquisition devices 22a and 22b, for one semiconductor chip 2, either a DC type or an AC type is used. For this reason, in one semiconductor chip 2, there are predetermined bonding points on which the electrical conduction state is unable to acquire by the electrical conduction state acquisition device, and non-bonding detection cannot be done using an electrical non-bonding detection step. Such predetermined bonding points are determined by the characteristics of the semiconductor chip 2; as a result, which points are predetermined bonding points is known before bonding, so that the predetermined bonding points, even when no conductivity is detected, are treated as bonded points and not as non-bonded points. After manufacture of semiconductor chips is finished, bonded lead frames are, at random times or after certain time intervals, picked up and tested in a separate testing process using a microscope or the like. However, because such testing is done off-line, the problems is that the results of the tests are not immediately fed back to the operation of the manufacturing apparatus, and defective products are produced in large quantities (see Japanese Patent No. 2992427, for example).

So as to deal with such problems, it has been proposed that products be tested for non-bonding by optical non-bonding detection that is done without taking them off the line (see Japanese Patent No. 2992427 and Patent Publication. H2 (1990)-12932, for example). This process images the bonded portions, and executes non-bonding detection by analyzing the resulting image data. One example of an image in the imaging device visual field 60 thereof is shown in FIGS. 10A and 10B. FIG. 10A shows an image of a normal bond, and FIG. 10B shows a non-bonding condition. At the center of FIG. 10B is a bonding point where there is no pressure-bonded ball; and in the top and below thereof, the bonding positions are shifted. The optical non-bonding detection thus detects non-bonding by detecting the presence or absence of a first bond portion 6 (pressure-bonded ball), or the position thereof, on the image data.

In this conventional method, however, though optical non-bonding detection is done without removing the lead frame from the wire bonding apparatus after bonding, the testing process is a separate process from the bonding process as shown in the flowchart in FIG. 9, and optical testing is conducted, sequentially fetching images of all of the pads 3 after first bonding all of the pads 3 (see Japanese Patent No. 2992427 and Patent Publication No. H2 (1990)-2932, for example).

In such a conventional optical non-bonding testing process as described above, time is required for the testing process because all of the bond portions are optically tested; as a result, the problem is that production efficiency deteriorates. There is also a problem in that overlap wiring such as multi-layer interconnections and stack interconnections, which have been more often used due to the increased complexity and higher integration in recent semiconductor chips, cannot be dealt with.

In multilayer interconnections, as shown in FIGS. 6A and 6B, a plurality of rows of pads 3 and 3' are arranged on the semiconductor chip 2, and a plurality of rows of leads 7 and 7' are arranged in correspondence therewith. The pad 3 and lead 7 near the end surface of each of the semiconductor chips 2 are connected by wires 12, while the pad 3' and lead 7' on the far side from the end surface of the semiconductor chips 2 are connected by wires 12'. This wire 12', as shown in FIG. 6B, connects the pad 3' and lead 7' in such manner that it crosses over the pad 3, lead 7, and wire 12.

On the other hand, as seen from FIGS. 7A and 7B, in stack interconnections, the semiconductor chip 2 has a stratified structure with a plurality of levels, pads 3 are deployed on each of the strata; and, as in the multilayer interconnections described above, the pad 3 and lead 7 near the end surface of the semiconductor chip 2 are connected by wire 12, while the pad 3' and lead 7' on the far side from the end surface of the semiconductor chips 2 are connected by wire 12' in such manner that it crosses over the pad 3, lead 7, and wire 12.

When wire-bonding is performed for such multilayer interconnections or stack interconnections, first the wire 12 near the end surface of the semiconductor chip 2 is bonded, and then the wire 12' on the far side from the end surface of the semiconductor chip 2 is bonded. However, in view of the fact that the wire 12' on the far side from the end surface of the semiconductor chip 2 crosses over the pad 3, lead 7, and wire 12 that is near the end surface of the semiconductor chip 2, in optical non-bonding detection that uses an imaging device after bonding is finished, the pad 3 and lead 7 near the end surface of the semiconductor chip 2 hide below the wire 12' that is on the far side from the end surface of the semiconductor chip 2 cannot be imaged. As a result, non-bonding detection is very difficult to execute.

Furthermore, in the conventional art, since the plan images are processed for optically detecting non-bonding, there is a problem in that, while the first bond portion 6 overlays the pad 3 and can be seen when viewed from above (in a plan), as shown in FIG. 8, in actuality, non-bonding in which the first bond portion 6 is separated from the pad 3 is unable to be detected.

BRIEF SUMMARY OF THE INVENTION

Accordingly, it is an object of the present invention to provide a bonding apparatus, program and method in which, for predetermined bonding points where an electrical non-bonding detection is not applicable, non-bonding detection is executed by optical non-bonding detection using an imaging device during the bonding process, and non-bonding detection is executed precisely in a short time.

It is another object of the present invention to provide a bonding apparatus, program and method in which an optical non-bonding detection is assuredly executed even in the bonding of overlap wiring such as multilayer interconnections or stack interconnections.

It is still another object of the present invention to provide a bonding apparatus, program and method in which non-bonding detection is assuredly executed in conditions wherein the bond is hanging free above (or floating up from) a pad.

The object of the present invention can be accomplished by a bonding method for a bonding apparatus for bonding a wire between a first bonding point and a second bonding point, wherein the method includes the steps of:

preparing
  a movement mechanism for moving, in XYZ directions, a capillary having a wire inserted therethrough and executing bonding on a work,
  an electrical conduction state acquisition device for detecting an electrical conduction state by applying an electric current from the wire to the work,
  an imaging device for taking image of the work, and
  a computer having a bonding control section for controlling the bonding apparatus and a memory unit for storing data;

an electrical non-bonding detection step for electrically detecting non-bonding between the first bonding point and the wire by processing electrical conduction state signals acquired by the electrical conduction state acquisition device and indicative of electrical conduction state between the first bonding point and the wire;

an optical non-bonding detection step for optically detecting non-bonding between the first bonding point and the wire by processing images acquired by the imaging device;

a data acquisition step for acquiring, from the memory unit, data on whether the first boding point is a predetermined bonding point on which the electrical non-bonding detection step is not applicable; and a non-bonding verification step for verifying non-bonding of the first bonding point using the optical non-bonding detection step when the first bonding point is the predetermined bonding point that is determined, based upon data acquired in the data acquisition step.

The bonding method can be a bonding method for a wire bonding apparatus that executes an overlap wiring in which a wire connecting a first boding point and a second bonding point is provided over another first bonding point, another second bonding point or another wire that connects another first bonding point and another second bonding point; and the optical non-bonding detection step can be an optical non-bonding detection step for optically detects wire non-bonding at first bonding point by processing a plurality of images acquired by a plurality of the imaging devices.

The object of the present invention is accomplished by a record medium storing a bonding control program executed by a wire bonding that includes:

a movement mechanism for moving, in XYZ directions, a capillary having a wire inserted therethrough and executing bonding on a work, an electrical conduction state acquisition device for applying an electric current from the wire to the work and detecting an electrical conduction state thereof, an imaging device for taking image of the work, and a computer having a bonding control section for controlling the bonding apparatus and a memory unit for storing data therein; and this record medium includes:

an electrical non-bonding detection program for electrically detecting non-bonding between the first bonding point and the wire by processing electrical conduction state signals acquired by the electrical conduction state acquisition device and indicative of electrical conduction state between a first bonding point and a wire, an optical non-bonding detection program for optically detecting non-bonding between the first bonding point and the wire by processing images acquired by the imaging device, a data acquisition program for acquiring, from the memory unit, data on whether the first boding point is a specific bonding point on which the electrical non-bonding detection program is not executable, and a non-bonding verification program for verifying non-bonding by the optical non-bonding detection program when the first bonding point is a specific bonding point that is determined, based upon data acquired by the data acquisition program.

The record medium may include a bonding control program for a wire bonding apparatus that executes an overlap wiring in which a wire connecting a first boding point and a second bonding point is provided over another first bonding point, another second bonding point or another wire that connects another first bonding point and another second bonding point; and the optical non-bonding detection program can be an optical non-bonding detection program that optically detects wire non-bonding at first bonding point by processing a plurality of images acquired by a plurality of the imaging device.

The object of the present invention is accomplished by a wire bonding apparatus that includes:

a movement mechanism for moving, in XYZ directions, a capillary having a wire inserted therethrough and executing bonding on a work;

an electrical conduction state acquisition device for detecting an electrical conduction state by applying an electric current from the wire to the work;

a first means for taking an image of the work; and a computer having a memory unit for storing data and a bonding control section for connecting between a first bonding point and a second bonding point with a wire, the computer including a second means for electrically detecting non-bonding between the first bonding point and the wire by processing electrical conduction state signals acquired by the electrical conduction state acquisition device and indicative of electrical conduction state between the first bonding point and the wire, a third means for optically detecting non-bonding between the first bonding point and the wire by processing images acquired by the first means, a fourth means for acquiring, from the memory unit, data on whether the first boding point is a predetermined bonding point on which the second means is not applicable, and a fifth means for verifying non-bonding of the first bonding point using the third means when the first bonding point is the predetermined bonding point that is determined, based upon data acquired by the fourth means.

The bonding apparatus can be a bonding apparatus that executes an overlap wiring in which a wire connecting a first boding point and a second bonding point is provided over another first bonding point, another second bonding point or another wire that connects another first bonding point and another second bonding point, and the third means can be a means that optically detects wire non-bonding at first bonding point by processing a plurality of images acquired by a plurality of the first means.

The present invention is advantageous in that for predetermined bonding points on which an electrical non-bonding detection is not applicable, non-bonding detection is executed by optical non-bonding detection step using an imaging device during the bonding process, thus executing non-bonding detection precisely in a short time.

BRIEF DESCRIPTION OF THE SEVERAL VIEWS OF THE DRAWINGS

FIGS. 3A and 3B show the electrical non-bonding detection type tables stored in the memory unit of the wire bonding apparatus of the present invention;

DETAILED DESCRIPTION OF THE INVENTION

Embodiments of the present invention will be described below. In the following descriptions, the same symbols are used for the portions that are the same as those described above relative to the conventional art, and no further description thereof will be given.

Figure 1:
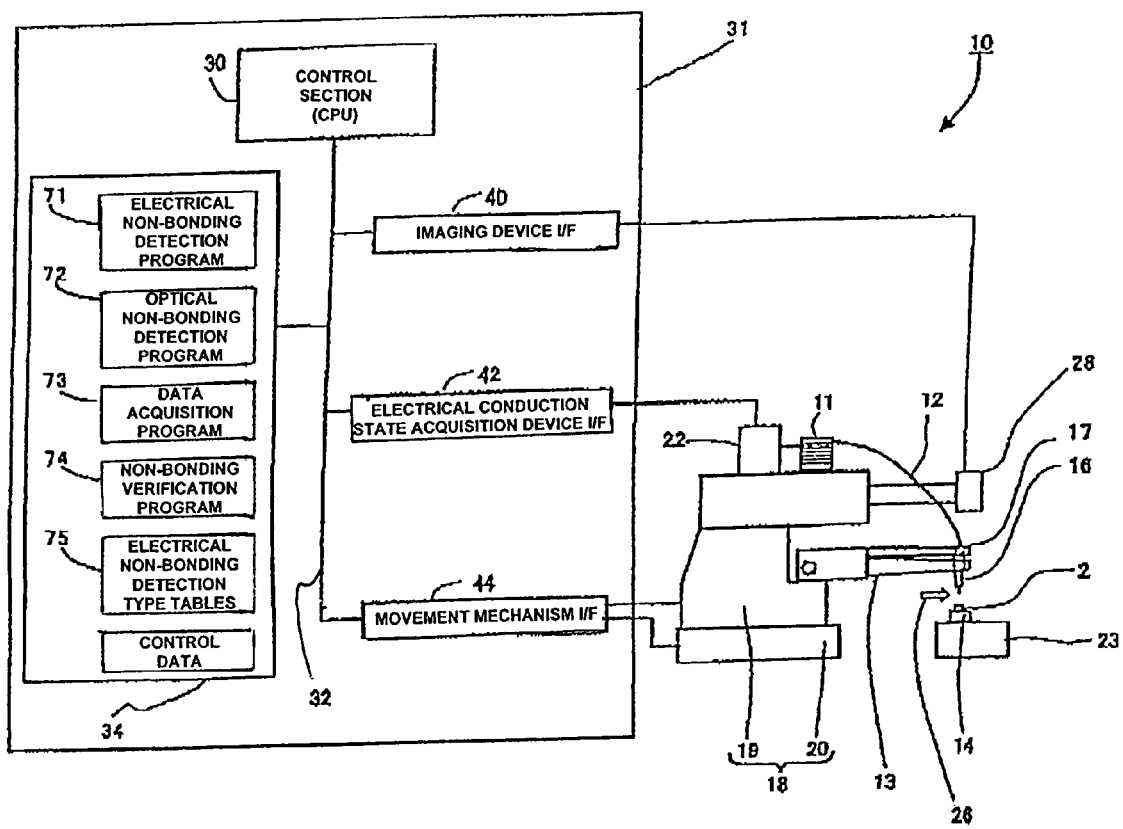
FIG. 1 is a system diagram for the wire bonding apparatus of the present invention.

In the wire bonding apparatus 10 of the present invention, as shown in FIG. 1, a bonding head 19 is provided on an XY table 20, a bonding arm 13 that is moved in the Z direction by a motor is provided on the bonding head 19, and a capillary 16 is attached to the tip end of the bonding arm 13.

The XY table 20 and the bonding head 19 make a movement mechanism 18. The movement mechanism 18 moves the bonding head 19 by the XY table 20 to any position within a horizontal plane (within the XY plane), and, by moving the bonding arm 13 attached to the bonding head 19 in the Z (vertical) direction, the capillary 16 at the tip of the bonding arm 13 is moved freely in the XYZ directions.

A wire 12 passes through the tip of the bonding arm 13. The wire 12 is wound on a spool 11. To the wire 12 wound on the spool 11, an electrical conduction state acquisition device 22 for acquiring the electrical conduction state between the wire 12 and the work 14 by way of applying electric current or electric voltage between them is connected.

To the bonding head 19, a clamper 17, which moves in the Z direction together with the capillary 16 and secures the wire 12, is attached so that it can be opened and closed freely. To the bonding head 19, furthermore, an imaging device 28 for imaging the position of the semiconductor chip 2 and imaging the work are mounted. In the vicinity of the tip end of the wire 12, moreover, a ball formation device 26 (called electric torch or electric flame off probe) is provided for effecting electrical discharges between the ball formation device 26 and the wire 12 and thus forming the tip end of the wire 12 into a ball 5.

The imaging device 28 is connected to an imaging device interface (I/F) 40, the electrical conduction state acquisition device 22 is connected to an electrical conduction state acquisition device interface (I/F) 42, and the movement mechanism 18 is connected to a movement mechanism interface (I/F) 44. These interfaces are connected by a data bus 32 to a control section (CPU-central processing unit) 30 for controlling the wire bonding apparatus, the control section 30 being installed in a computer 31. To the data bus 32 is also connected a memory unit 34 for storing control data and data from electrical non-bonding detection type tables 75 for the pads 3 (first bonding points) shown in (a) and (b) of FIG. 3. The above-described computer 31 includes an imaging device interface (I/F) 40, an electrical conduction state acquisition device interface (I/F) 42, a movement mechanism interface (I/F) 44, a memory unit 34, a data bus 32, and the control section 30. The memory unit 34 in the present invention includes both internal memory section and external memory section. The internal memory section has a function to, among others, store, read-out and write-in the control data, and the external memory section functions as a medium read by computer.

The electrical non-bonding detection type tables 75 shown in shown in FIGS. 3A and 3B are data tables recorded with what kind of electrical non-bonding detection is possible in the respective pads.

The tables 75 contain data indicating whether, when the DC electrical conduction state acquisition device 22a is used for non-bonding detection for some semiconductor chip 2, the pads are (a) points that use the positive voltage power supply 55 (indicated by POS in FIG. 3A), or (b) points that use the negative voltage power supply 56 (indicated by NEG in FIG. 3A), or (c) points for which the resistance is very large and the electrical conduction state cannot be acquired by the DC electrical conduction state acquisition device 22a (indicated by NO in FIG. 3A).

Also contained in the electrical non-bonding detection type tables 75 are data indicating whether, when the AC electrical conduction state acquisition device 22b is used for non-bonding detection for a semiconductor chip 2, the pads are (d) points where the AC electrical conduction state acquisition device 22b can be used (indicated by YES in FIG. 3B), or (e) points for which the electrostatic capacitance is very small and the electrical conduction state cannot be acquired by the AC electrical conduction state acquisition device 22b (indicated by NO in FIG. 3B).

Figure 2:
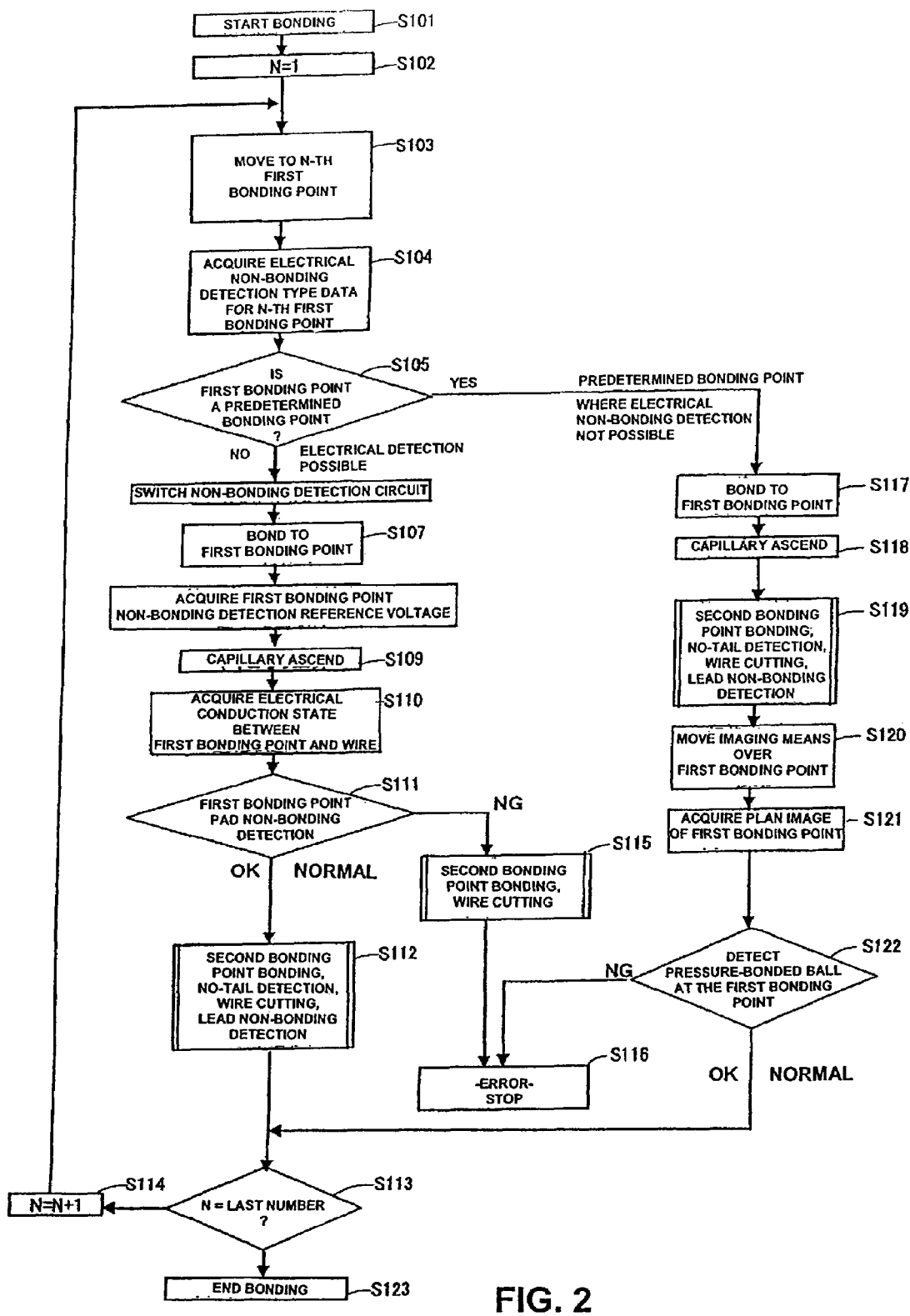
FIG. 2 is a flowchart of the wire bonding process of the present invention.
Figure 4:
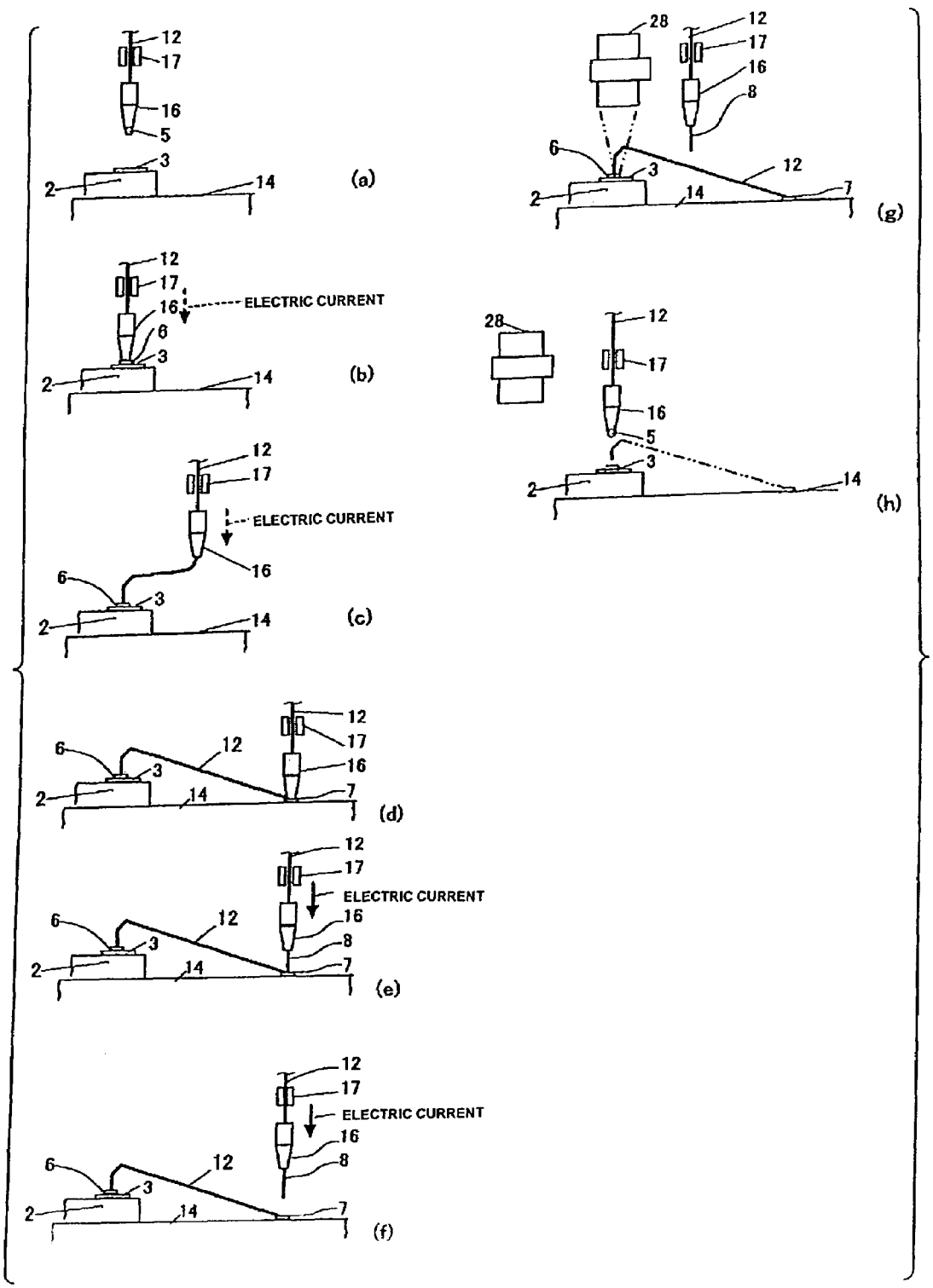
FIG. 4 shows the steps (a) through (h) of the wire bonding method of the present invention.

The wire bonding apparatus 10 structured as described above is controlled by the computer 31 and executes wire bonding and non-bonding detection by such steps as described below. The following description will be made on steps for performing bonding to the semiconductor chip 2 using the DC electrical conduction state acquisition device 22a:

(1) The tip end of the wire 12 is formed into a ball 5 by the ball formation device 26 (electric torch), the position of the semiconductor chip 2 is detected by the imaging device 28, and the capillary 16 is moved over the N-th pad 3 (first bonding point) by the movement mechanism 18 (step 103 in FIG. 2, step (a) in FIG. 4).

(2) The control section 30 of the computer 31 acquires DC type electrical non-bonding detection type data for a given pad point from the pad number of each one of the semiconductor devices listed in the electrical non-bonding detection type tables 75 in the memory unit 34 (step S104 in FIG. 2). Such acquisition is performed in the data acquisition step executed by the data acquisition program 73. In this data acquisition program 73, when N=1, for example, "POS" data indicating a point where the positive voltage power supply 55 is used are acquired, when N=3, "NEG" data indicating a point where the negative voltage power supply 56 is used are acquired, and when N=5, "NO" data indicating a point where the electrical conduction state cannot be acquired with the DC electrical conduction state acquisition device 22a are acquired.

(3) The control section 30 of the computer 31 determines, based on the acquired data, whether the given N-th pad 3 (first bonding point) is a predetermined bonding point where the electrical non-bonding detection step is not applicable (step S105 in FIG. 2). In the examples noted above, the N=5 pad (first bonding point) is determined to be a predetermined bonding point, while the N=1 and 3 pads are determined to be ordinary bonding points.

Figure 11:
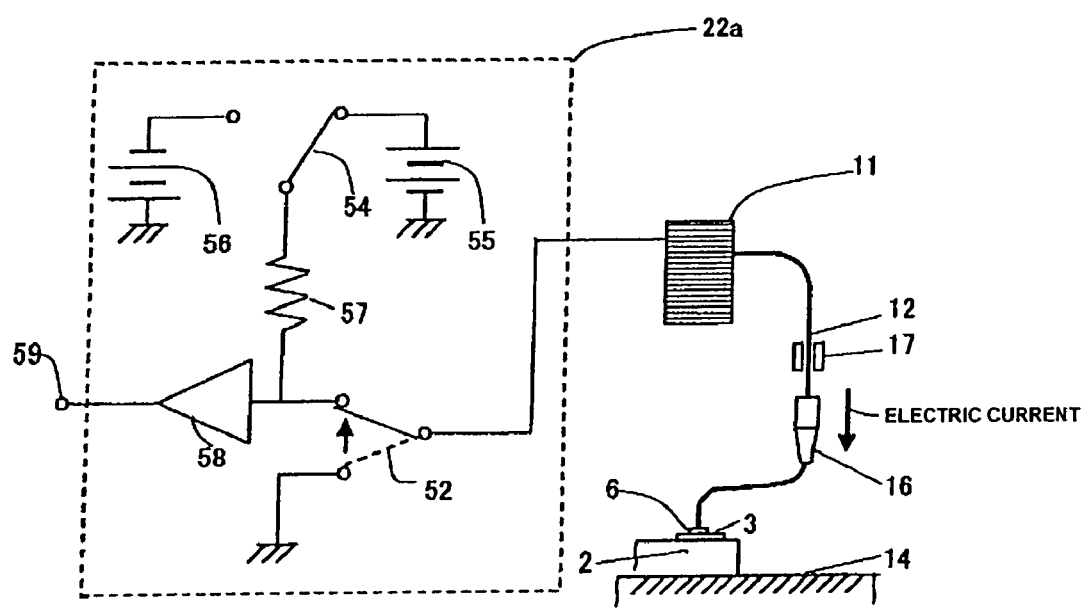
FIG. 11 illustrates the DC electrical conduction state acquisition device in conventional art.
Figure 12:
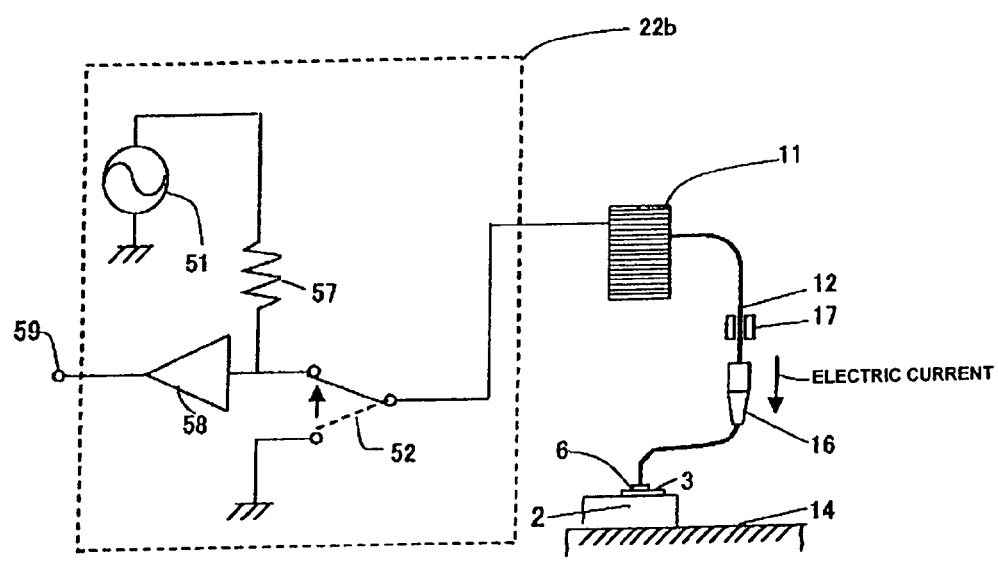
FIG. 12 illustrates an AC electrical conduction state acquisition device in conventional art.
Figure 13:
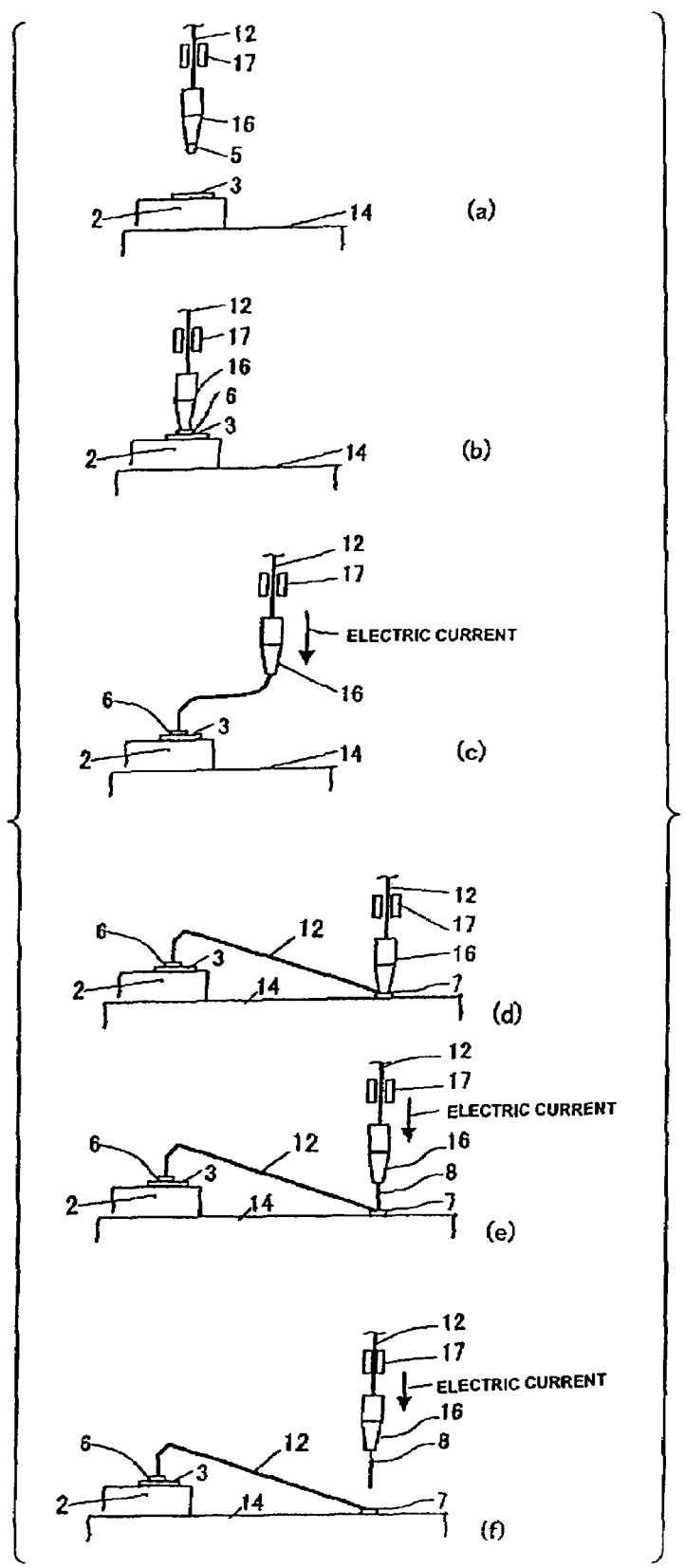
FIG. 13 shows the steps (a) to (f) of the wire bonding actions in the conventional art.
Figure 14:
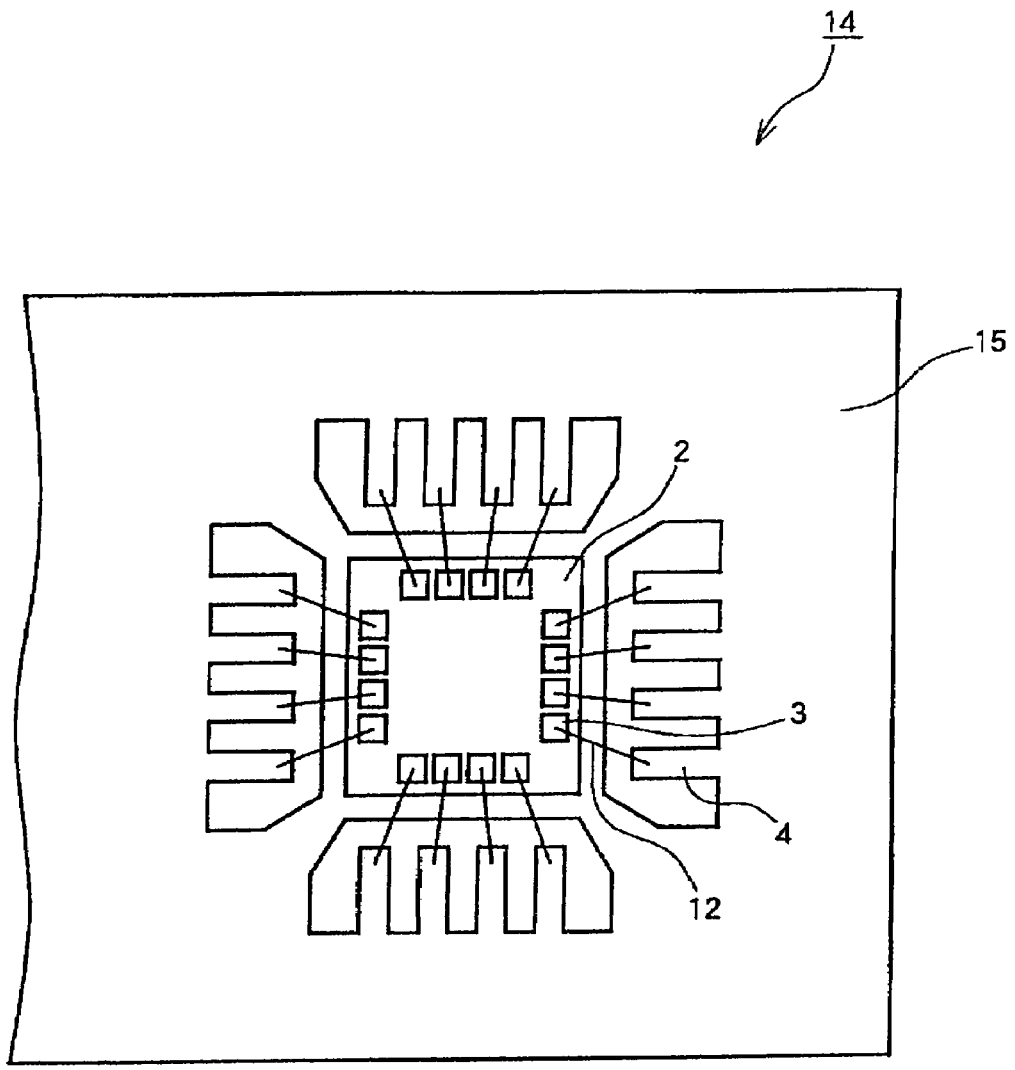
FIG. 14 is a top view of a semiconductor chip wire-bonded to a lead frame.

(4) When a given bonding point is an ordinary bonding point such as N=1 or 3, if the DC electrical non-bonding detection type acquired is "POS," the switch 54 (see FIG. 11) is switched to the positive voltage power supply 55 side; and if the DC electrical non-bonding detection type acquired is "NEG," the switch 54 (see FIG. 11) is switched to the negative voltage power supply 56 side (step S106 in FIG. 2).

(5) The capillary 16 is lowered, and bonding is performed on the pad 3 (first bonding point) (step S107 in FIG. 2, step (b) in FIG. 4). The ball 5 is pressure-bonded on the pad 3 (first bonding point), thus forming a first bond portion 6 (pressure-bonded ball).

(6) With the ball thus pressure-bonded, the on-off switch 52 of the DC electrical conduction state acquisition device 22*a* is closed, an electric current ("current") flows from the wire 12 to the work 14, and the voltage at that time is acquired by the DC electrical conduction state acquisition device 22*a* as a reference voltage. The acquired data are input to the control section 30 through the electrical conduction state acquisition device interface (I/F) 42 (step S108 in FIG. 2, step (b) in FIG. 4).

(7) The movement mechanism 18 causes the capillary 16 to ascend from the pad 3 (first bonding point) and to move the capillary 16 laterally (step S109 in FIG. 2, step (c) in FIG. 4).

(8) While the capillary 16 is moving, the on-off switch 52 of the DC electrical conduction state acquisition device 22*a* is closed, a current flows from the wire 12 to the work 14, and the electrical conduction state at that time is acquired by the DC electrical conduction state acquisition device 22*a*. The acquired data are input to the control section 30 through the electrical conduction state acquisition device interface (I/F) 42 (step S110 in FIG. 2, step (c) in FIG. 4).

(9) By way of processing, by the computer 31, a signal from the DC electrical conduction state acquisition device 22*a* with the electrical non-bonding detection program 71, non-bonding of the pad 3 (first bonding point) is detected. For example, if there is a difference between the reference voltage acquired in step S108 and the electrical conduction state acquired by step S110, then that is determined to be a non-bonding; and if the voltages are the same, then that is determined to be no non-bonding. When non-bonding is detected, the capillary 16 continues moving as it did to the lead 4 (second bonding point) and, after performing bonding at the lead 4 (second bonding point), stops with an error (step S115 and S116 in FIG. 2). However, acquisition of the electrical conduction state for detecting a no-tail condition or lead non-bonding at the lead 4 (second bonding point) is not executed. The above-described electrical conduction state acquisition device 22*a* has, for the purpose of detecting non-bonding, a resistor 57 therein; and the electrical non-bonding detection program 71 makes the control section 30 compare the data which are A/D-converted via the electrical conduction state acquisition device interface (I/F) 42 and the non-bonding detection reference voltage data stored beforehand in the memory unit 34; and if the A/D-converted data are out of the range of the non-bonding detection reference voltage data, then it is determined by the electrical non-bonding detection program 71 that non-bonding exists.

(10) When no non-bonding is detected by the electrical non-bonding detection program 71, and it is determined that bonding was done normally; then the capillary 16 continues moving as it did to the lead 4 (second bonding point); and, after performing bonding at the lead 4 (second bonding point), an electrical conduction state acquisition is effected in order to detect no-tail or lead non-bonding conditions at the lead 4 (second bonding point), so that lead (second bonding point) non-bonding detection is executed (step S112 in FIG. 2).

(11) In step S104 of FIG. 2, when it is determined that a given bonding point is a predetermined bonding point such as N=5 where the electrical non-bonding detection step is not applicable, then the computer 31, without activating the DC electrical conduction state acquisition device 22*a,* moves the capillary 16 down and performs bonding on the pad 3 (first bonding point) (step S117 in FIG. 2, step (b) in FIG. 4). The ball 5 is pressure-bonded on the pad 3 (first bonding point), and the first bond portion 6 (pressure-bonded ball) is formed.

(12) Then, the capillary is caused to ascend in like manner as for an ordinary bonding point, and bonding to the lead 4 (second bonding point), no-tail detection, and lead non-bonding detection are performed (step S119 in FIG. 2, steps (c) to (f) in FIG. 4).

Figure 10A:
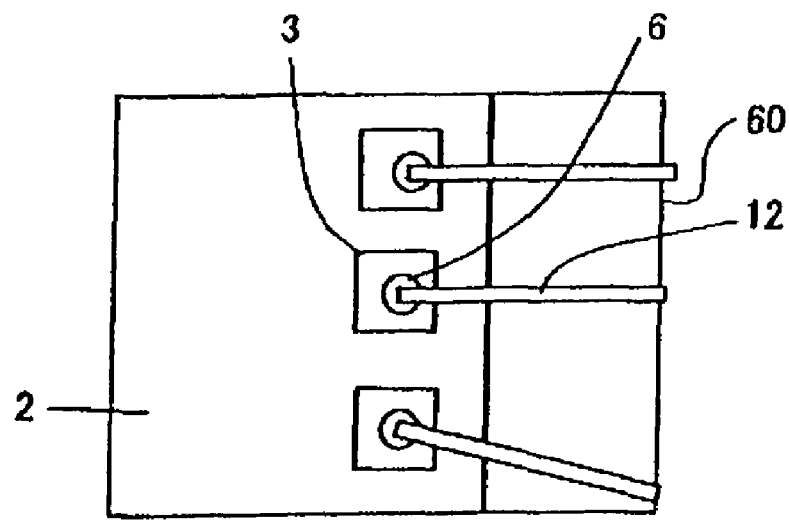
FIGS. 10A and 10B show plane images of a pad acquired by a plane image acquisition means in conventional art.
Figure 10B:
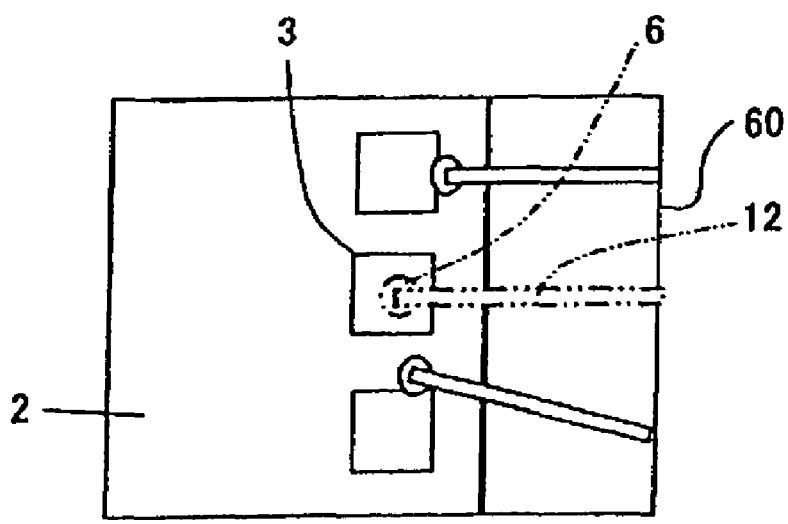

(13) The computer 31 moves, by the movement mechanism 18, the imaging device 28 that is comprised, for instance, of a camera having a digital image sensor, such as a CCD (Charge-Coupled Device) camera and CMOS (Complementary Metal-Oxide-Semiconductor) camera, to a position where the pad 3 (first bonding point) will be in the visual field 60 thereof (step S120 in FIG. 2). Then, a plane image of the vicinity of the pad 3 (first bonding point) that is the predetermined bonding point is acquired by the imaging device 28 (step S121 in FIG. 2, step (g) in FIG. 4). The acquired plane image, as in the conventional art, is input through the imaging device interface (I/F) 40 to the control section 30, and that image is analyzed (step S122 in FIG. 2). Examples of acquired plane images are shown in FIGS. 10A and 10B. FIG. 10A shows the bonding performed normally, and FIG. 10B shows a non-bonding.

(14) When it is determined by the optical non-bonding detection step, which is executed by an optical non-bonding detection program 72, that the pad 3 (first bonding point) that is the predetermined bonding point is non-bonding, then error processing is executed, and the wire bonding apparatus 10 is stopped (step S116 in FIG. 2). More specifically, the optical non-bonding detection program 72 has a function to make the control section 30 compare image measuring value data and reference data. The image measuring value data are those obtained by converting a plane image, which is of around the pad 3 (first bonding point) and obtained by the imaging device 28, into image measuring values via the imaging device interface (I/F) 40; and the reference data are those stored beforehand in the memory unit 34 on pad 3. If, as a result of comparison, the data converted by the imaging device 28 do not match the reference data, then it is determined that non-bonding exists. Furthermore, a non-bonding verification program 74 has a function to confirm whether or not the pad 3 (first bonding point) at a particular bonding point is not bonded.

(15) When no non-bonding is detected, and it is determined that bonding was performed normally, the next pad 3 (first bonding point) is moved to and bonding is continued (steps S113 and S114 in FIG. 2, step (h) in FIG. 4).

(16) When bonding and detection have finished for all points, the bonding action ends (step S123 in FIG. 2).

In the above bonding method, the electrical conduction states are obtained using the DC electrical conduction state acquisition device 22*a*, and an electrical non-bonding detection is executed. However, the present invention is applicable also to a bonding method that uses alternating current, and the basic overall process of a bonding method using alternating current is the same as the method that uses direct current. When the alternating current is used, however, an alternating current power supply 51 is used; and in this case, there is no need of switching between the positive voltage power supply 55 and the negative voltage power supply 56, and step S106 in FIG. 2 for the non-bonding detection circuit switching is not employed.

As described above, in the shown embodiment, it is possible to conduct non-bonding detection precisely in a short time by way of using the imaging device during the bonding process for detecting non-bonding by optical non-bonding detection for the predetermined bonding points where the electrical non-bonding detection step is not applicable; accordingly, production efficiency is high; and, since, during the manufacturing process, the non-bonding detection on the predetermined bonding point is executed, even if non-bonding occurs, such non-bonding can be assuredly detected at that time, and it is possible to reduce the defective products in number and to attain quality improvement.

Figure 6A:
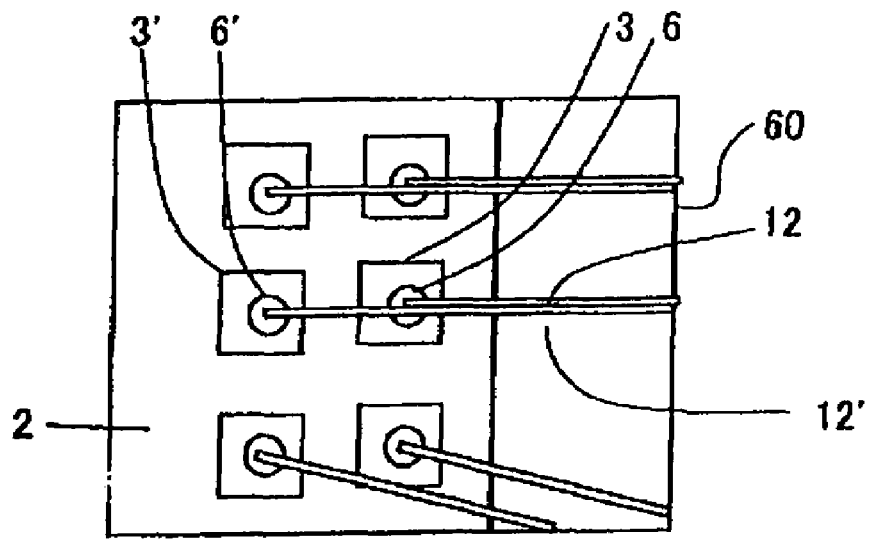
FIGS. 6A and 6B, a top view and a side view, respectively, illustrate a manner of multilayer interconnection used in the present invention.
Figure 6B:
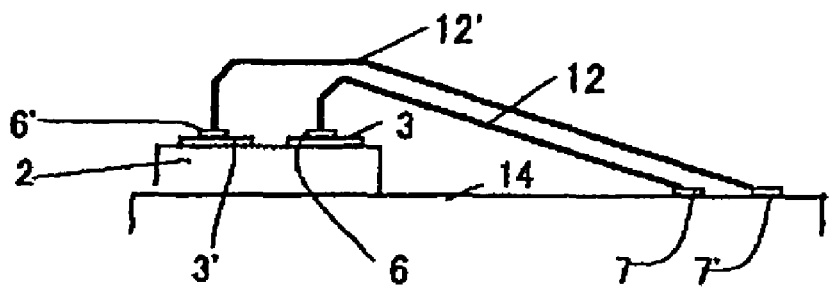
Figure 7A:
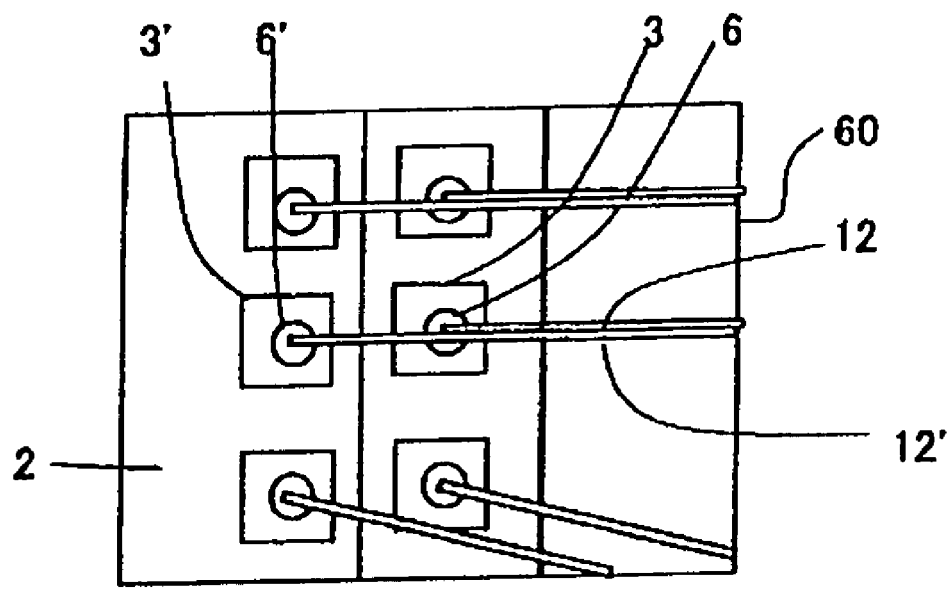
FIGS. 7A and 7B, a top view and a side view, respectively, illustrate a manner of stack interconnection used in the present invention.
Figure 7B:
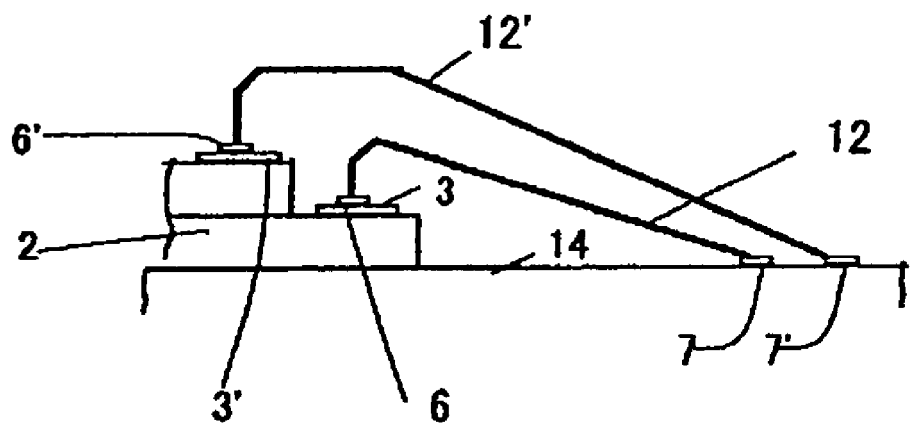

Next, a process in a case where predetermined bonding points, on which an electrical non-bonding detection is not applicable, in multilayer interconnections, as shown in FIGS. 6A and 6B, are bonded will be described. The same symbols are used to the portions that are the same as those in the ordinary bonding process (which is described above for non-multilayer interconnections), and no further description thereof will be provided.

Figure 5:
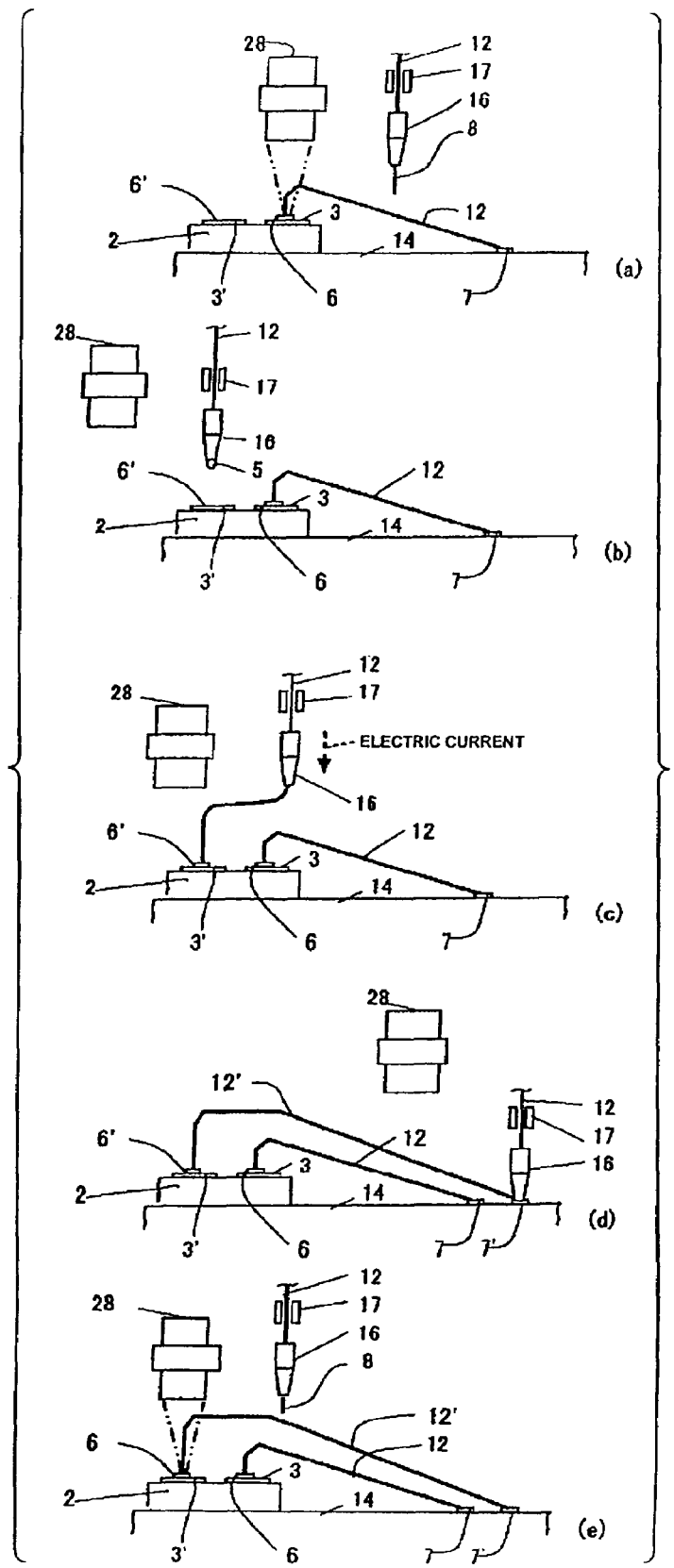
FIG. 5 shows the steps (a) through (e) of the wire bonding method of the present invention performing multilayer interconnection.

(1) When a pad 3 that is near the end surface of the semiconductor chip 2 is a predetermined bonding point where an electrical non-bonding detection step is not applicable, after connecting between the lead 7 and the pad 3 that is near the end surface of the semiconductor chip 2 with a wire 12, the imaging device 28 is moved over the pad 3 (first bonding point) that is the predetermined bonding point, and non-bonding detection is executed therefor in non-bonding verification step executed by the non-bonding verification program 74 using the optical non-bonding detection step (step (a) in FIG. 5).

(2) The tip end of the wire 12 is formed into a ball 5 by the ball formation device 26, the position of the semiconductor chip 2 is detected by the imaging device 28, and the capillary 16 is moved by the movement mechanism 18 over the pad 3' (first bonding point) that is on the semiconductor chip 2 and far from the end surface thereof (step (b) in FIG. 5).

(3) By the same process as in the above described ordinary interconnect bonding, connection with wire 12' is performed between the lead 7' and pad 3' which is on the far side from the end surface of the semiconductor chip 2. This wire 12' is connected over and across the pad 3, lead 7, and wire 12, as seen from steps (c) and (d) in FIG. 5 and from FIG. 6.

(4) Once the bonding to the lead 4 (second bonding point) ends, the capillary 16 is moved by the movement mechanism 18 over the pad 3' (first bonding point) which is on the far side from the end surface of the semiconductor chip 2 and is the predetermined bonding point, and non-bonding detection is executed optically by the imaging device 28 on the pad 3' that is the predetermined bonding point.

(5) When the pad 3 and 3' are not predetermined bonding points, then, as in the ordinary bonding process, the electrical conduction states are acquired by the DC electrical conduction state acquisition device 22*a*, non-bonding is detected by the electrical non-bonding detection step, and determinations of bonding or non-bonding are made.

As seen from the above, in the bonding method of the embodiment shown above, in each bonding cycle, predetermined bonding points where the electrical non-bonding detection step is not applicable are subjected to non-bonding detection by the optical non-bonding detection step that is executed by the optical non-bonding detection program. As a result, even in multilayer interconnect bonding, non-bonding detection is executed assuredly without the imaging visual field being obstructed by wires. In general, multilayer interconnections or stack interconnections are employed in highly integrated chips where the number of pads is large. In view of that fact, such a high-precision non-bonding detection method as in the present invention is beneficial in that defective products can be effectively made fewer, and production efficiency improves greatly.

Figure 8:
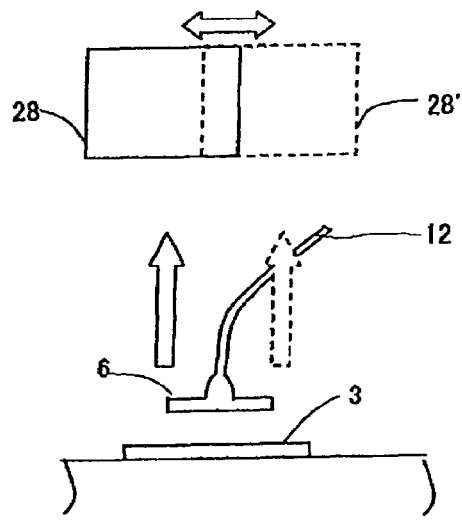
FIG. 8 shows a manner of acquisition of plane images by a plurality of imaging devices in the present invention.
Figure 9:
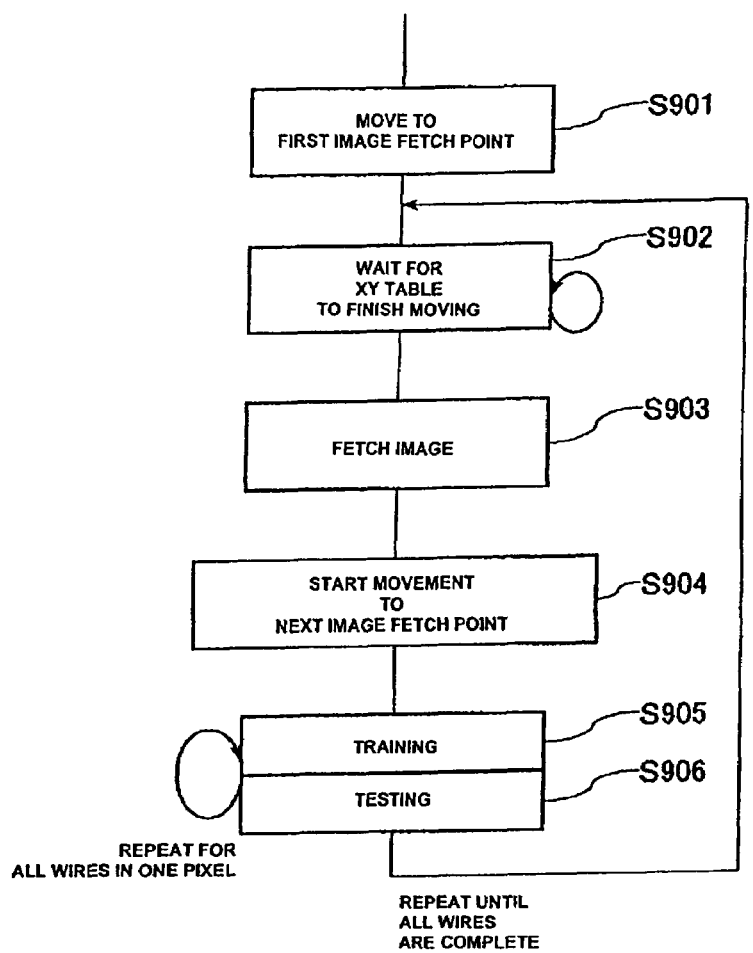
FIG. 9 is a flowchart of the optical detection process of conventional art.

In the bonding process of the above embodiment, the position of the imaging device 28 for acquiring plane images is moved freely by command from the control section 30. Accordingly, a plane image of a pad 3 (first bonding point) or first bond portion 6 can be captured from two different points (FIG. 8). By processing images captured from two points in this way, differences in the heights of the pad 3 (first bonding point) and first bond portion 6 can be measured. It can then be determined, when that height difference is greater than a prescribed threshold value, that the first bond portion 6 is hanging free above (floating up from) the pad 3, thus finding the non-bonding.

As seen from the above, according to the embodiment described above, a benefit is realized in that, by processing imaging data from two different points and not only a plane image, distances in the height dimension can be measured, and non-bonding detection can be optically performed more accurately.

The invention claimed is:

1. A bonding method for a bonding apparatus for bonding a wire between a first bonding point and a second bonding point, comprising the steps of:

preparing
  a movement mechanism for moving, in XYZ directions, a capillary having a wire inserted therethrough and executing bonding on a work,
  an electrical conduction state acquisition device for detecting an electrical conduction state by applying an electric current from the wire to the work,
  an imaging device for taking image of the work, and
  a computer having a bonding control section for controlling the bonding apparatus and a memory unit for storing data;
an electrical non-bonding detection step for electrically detecting non-bonding between the first bonding point and the wire by processing electrical conduction state signals acquired by said electrical conduction state acquisition device and indicative of electrical conduction state between the first bonding point and the wire;

an optical non-bonding detection step for optically detecting non-bonding between the first bonding point and the wire by processing images acquired by said imaging device;

a data acquisition step for acquiring, from said memory unit, data on whether the first bonding point is a predetermined bonding point on which said electrical non-bonding detection step is not applicable; and a non-bonding verification step for verifying non-bonding of the first bonding point using said optical non-bonding detection step when the first bonding point is said predetermined bonding point that is determined, based upon data acquired in said data acquisition step.

2. The bonding method according to claim 1, wherein said bonding method is for a wire bonding apparatus that executes an overlap wiring in which a wire connecting a first bonding point and a second bonding point is provided over another first bonding point, another second bonding point or another wire that connects another first bonding point and another second bonding point.

3. The bonding method according to claim 1, wherein said optical non-bonding detection step optically detects wire non-bonding at first bonding point with processing a plurality of images acquired by a plurality of said imaging devices.

4. A record medium storing a bonding control program executed by a wire bonding apparatus comprising:

a movement mechanism for moving, in XYZ directions, a capillary having a wire inserted therethrough and executing bonding on a work, an electrical conduction state acquisition device for applying an electric current from the wire to the work and detecting an electrical conduction state thereof, an imaging device for taking image of the work, and a computer having a bonding control section for controlling the bonding apparatus and a memory unit for storing data therein;

said record medium including:

an electrical non-bonding detection program for electrically detecting non-bonding between the first bonding point and the wire by processing electrical conduction state signals acquired by the electrical conduction state acquisition device and indicative of electrical conduction state between a first bonding point and a wire, an optical non-bonding detection program for optically detecting non-bonding between the first bonding point and the wire by processing images acquired by the imaging device, a data acquisition program for acquiring, from the memory unit, data on whether the first bonding point is a specific bonding point on which the electrical non-bonding detection program is not executable, and a non-bonding verification program for verifying non-bonding by the optical non-bonding detection program when the first bonding point is a specific bonding point that is determined, based upon data acquired by the data acquisition program.

5. The record medium storing a bonding control program according to claim 4, wherein said bonding control program is for a wire bonding apparatus that executes an overlap wiring in which a wire connecting a first bonding point and a second bonding point is provided over another first bonding point, another second bonding point or another wire that connects another first bonding point and another second bonding point.

6. The record medium storing a bonding control program according to claim 4, wherein said optical non-bonding detection program optically detects wire non-bonding at first bonding point by processing a plurality of images acquired by a plurality of said imaging device.

7. A wire bonding apparatus comprising:

a movement mechanism for moving, in XYZ directions, a capillary having a wire inserted therethrough and executing bonding on a work;

an electrical conduction state acquisition device for detecting an electrical conduction state by applying an electric current from the wire to the work;

a first means for taking an image of the work; and a computer having a memory unit for storing data and a bonding control section for connecting between a first bonding point and a second bonding point with a wire, said computer including a second means for electrically detecting non-bonding between the first bonding point and the wire by processing electrical conduction state signals acquired by said electrical conduction state acquisition device and indicative of electrical conduction state between the first bonding point and the wire, a third means for optically detecting non-bonding between the first bonding point and the wire by processing images acquired by said first means, a fourth means for acquiring, from said memory unit, data on whether the first bonding point is a predetermined bonding point on which said second means is not applicable, and a fifth means for verifying non-bonding of the first bonding point using said third means when the first bonding point is said predetermined bonding point that is determined, based upon data acquired by said fourth means.

8. The bonding apparatus according to claim 7, wherein said bonding apparatus executes an overlap wiring in which a wire connecting a first bonding point and a second bonding point is provided over another first bonding point, another second bonding point or another wire that connects another first bonding point and another second bonding point.

9. The bonding apparatus according to claim 7, wherein said third means optically detects wire non-bonding at first bonding point with processing a plurality of images acquired by a plurality of said first means.

* * * * *